(12) United States Patent
Kim

(10) Patent No.: US 8,242,022 B2
(45) Date of Patent: Aug. 14, 2012

(54) METHOD FOR FORMING FINE PATTERN USING QUADRUPLE PATTERNING IN SEMICONDUCTOR DEVICE

(75) Inventor: Won-Kyu Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 495 days.

(21) Appl. No.: 12/493,180

(22) Filed: Jun. 27, 2009

(65) Prior Publication Data

US 2010/0167548 A1 Jul. 1, 2010

(30) Foreign Application Priority Data

Dec. 31, 2008 (KR) ........................ 10-2008-0138590

(51) Int. Cl.
H01L 21/311 (2006.01)
H01L 21/302 (2006.01)
H01L 21/461 (2006.01)

(52) U.S. Cl. ......... 438/696; 438/700; 438/717; 438/736

(58) Field of Classification Search ........................ None
See application file for complete search history.

(56) References Cited

U.S. PATENT DOCUMENTS

| 6,030,541 | A * | 2/2000 | Adkisson et al. | ................ 216/51 |
| 2006/0211260 | A1 * | 9/2006 | Tran et al. | ..................... 438/763 |
| 2007/0287239 | A1 * | 12/2007 | Yoon et al. | ..................... 438/184 |
| 2008/0153301 | A1 * | 6/2008 | Tanaka et al. | .................. 438/703 |
| 2008/0160772 | A1 * | 7/2008 | Kong | ............................. 438/703 |
| 2010/0258913 | A1 * | 10/2010 | Lue | ................................ 257/618 |

FOREIGN PATENT DOCUMENTS

| KR | 100790999 | 1/2008 |
| KR | 100827526 | 5/2008 |
| KR | 1020100079002 | 7/2010 |

OTHER PUBLICATIONS

Notice of Allowance issued from Korean Intellectual Property Office on Oct. 27, 2010.

* cited by examiner

*Primary Examiner* — Shamim Ahmed
*Assistant Examiner* — Bradford Gates
(74) *Attorney, Agent, or Firm* — IP & T Group LLP

(57) ABSTRACT

A method for forming a fine pattern in a semiconductor device using a quadruple patterning includes forming a first partition layer over a first material layer which is formed over a substrate, performing a photo etch process on the first partition layer to form a first partition pattern, performing an oxidation process to form a first spacer sacrificial layer over a surface of the first partition pattern, forming a second spacer sacrificial layer over the substrate structure, forming a second partition layer filling gaps between the first partition pattern, removing the second spacer sacrificial layer, performing an oxidation process to form a third spacer sacrificial layer over a surface of the second partition layer and define a second partition pattern, forming a third partition pattern filling gaps between the first partition pattern and the second partition pattern, and removing the first and third spacer sacrificial layers.

19 Claims, 11 Drawing Sheets

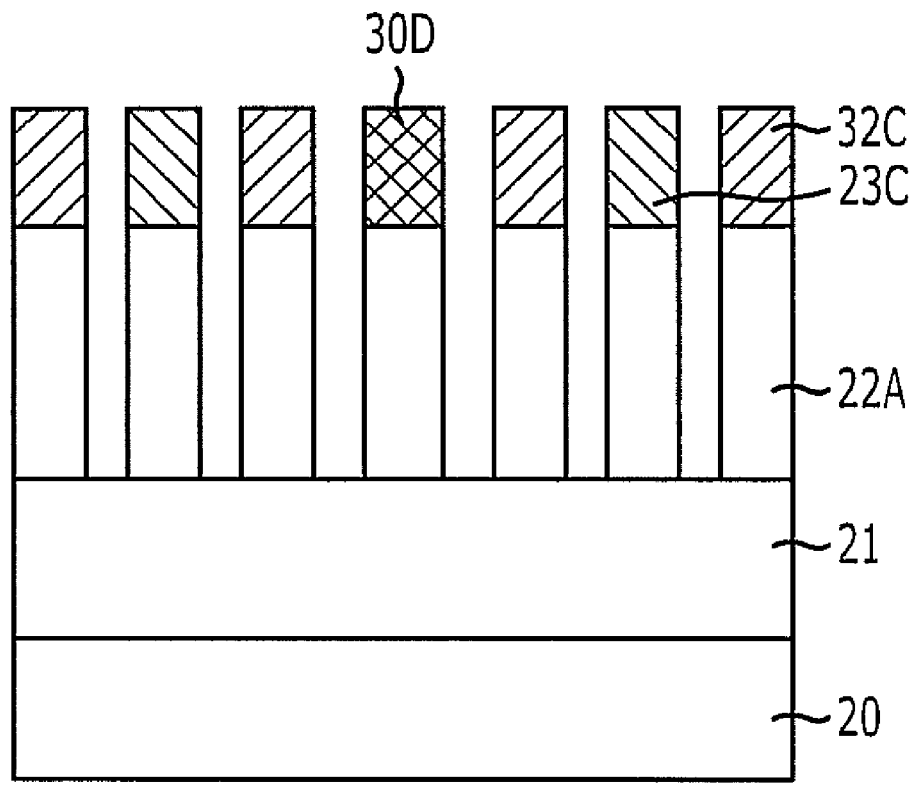

METHOD FOR FORMING FINE PATTERN USING QUADRUPLE PATTERNING IN SEMICONDUCTOR DEVICE

CROSS-REFERENCE TO RELATED APPLICATIONS

The present invention claims priority of Korean patent application number 10-2008-0138590, filed on Dec. 31, 2008, the disclosure of which is incorporated herein by reference in its entirety.

BACKGROUND OF THE INVENTION

The present invention relates to a method for fabricating a semiconductor device, and more particularly, to a method for forming a fine pattern in a semiconductor device using a quadruple patterning.

As semiconductor devices are continuously becoming highly integrated, micronization of various patterns, e.g., lines and space patterns, needed for forming circuits constituting a semiconductor device is accelerating.

However, there are limitations as to the micronization of patterns due to limitations of photolithography equipments, in particular, photo-exposure equipments. It is difficult for the current photo-exposure equipments to form a fine pattern having a line width smaller than 40 nm due to resolution limitations.

Therefore, a new type of technology which can form a fine pattern having dimensions below the limiting resolution by using the current photo-exposure equipments is desired. A pattern doubling technology using a spacer patterning is one of the most widely researched technology for forming a fine pattern up to now.

FIGS. 1A to 1G illustrate cross-sectional views of a typical method for forming a fine pattern by performing a pattern doubling technology using a spacer patterning. Referring to FIG. 1A, a typical pattern doubling process using a spacer patterning includes forming an etch target layer 11 over a substrate 10. A hard mask layer 12 including tetraethyl orthosilicate (TEOS) is formed over the etch target layer 11. A first polysilicon layer 13, an amorphous carbon layer 14, and a silicon oxynitride (SiON) layer 15 are formed over the hard mask layer 12. A bottom anti-reflective coating (BARC) layer 16 and a photoresist layer are formed over the silicon oxynitride layer 15. A photo-exposure and developing process using a mask is performed to form a photoresist pattern 17.

Referring to FIG. 1B, the bottom anti-reflective coating layer 16, the silicon oxynitride layer 15, the amorphous carbon layer 14 are etched using the photoresist pattern 17 as an etch barrier. The first polysilicon layer 13 is etched using the etched amorphous carbon layer 14 as an etch barrier to form a first polysilicon pattern 13A. Herein, portions of the exposed hard mask layer 12 are etched to an etch target of substantially the same thickness as that of a subsequent spacer oxide layer. Reference denotation 12A represents an etched hard mask layer 12A.

Meanwhile, the photoresist pattern 17 and remaining portions of the bottom anti-reflective coating layer 16, the silicon oxynitride layer 15, and the amorphous carbon layer 14 are mostly removed during the etching process.

Referring to FIG. 1C, a spacer oxide layer 18 is formed over the surface profile of the substrate structure. Herein, the spacer oxide layer 18 is formed to a thickness which can fill the etched regions of the etched hard mask layer 12A.

Referring to FIG. 1D, a second polysilicon layer 19 is formed over the substrate structure. Herein, the second polysilicon layer 19 is formed to a thickness sufficient to, for example, completely fill spaces between the first polysilicon pattern 13A.

Referring to FIG. 1E, the second polysilicon layer 19 is recessed until the spacer oxide layer 18 is exposed. Herein, an etch-back process or a chemical mechanical polishing (CMP) process may be performed to form a recessed second polysilicon pattern 19A.

Referring to FIG. 1F, the spacer oxide layer 18 is selectively etched to form a first etched spacer oxide pattern 18A. Herein, the spacer oxide layer 18 is etched in a manner that the first etched spacer oxide pattern 18A remains in regions to be etched during a subsequent etching of the etched hard mask layer 12A. Portions of the first polysilicon pattern 13A and the second polysilicon pattern 19A are also etched while etching the spacer oxide layer 18. Reference denotations 13B and 19B represent an etched first polysilicon pattern 13B and an etched second polysilicon pattern 19B, respectively. Consequently, the etched first polysilicon pattern 13B and the etched second polysilicon pattern 19B are alternately formed.

Referring to FIG. 1G, the first etched spacer oxide pattern 18A and the etched hard mask layer 12A are etched using the etched first polysilicon pattern 13B and the etched second polysilicon pattern 19B as an etch barrier to form a second etched spacer oxide pattern 18B and a hard mask 12B. Reference denotations 13C and 19C represent a remaining first polysilicon pattern 13C and a remaining second polysilicon pattern 19C, respectively.

Although not illustrated, the etch target layer 11 is etched using the hard mask 12B as an etch barrier. Material layers remaining over the etched etch target layer 11 are removed to complete a patterning process on the etch target layer 11.

As described above, a fine pattern having a line width of approximately 20 nm may be embodied by performing the pattern doubling technology using the spacer patterning method.

However, when a fine pattern having a line width of less than 20 nm is required due to larger scale integration, limitations may arise from the limiting resolution of photo-exposure equipments even if the pattern doubling technology is used. Thus, a quadruple patterning technology has been introduced to overcome such limitations.

The currently introduced quadruple patterning technology includes repeatedly performing the typical spacer patterning two times. That is, the processes shown in FIGS. 1A to 1F are performed and then the processes shown in FIGS. 1C to 1G are performed once again.

The typical quadruple patterning technology may not be able to guarantee pattern fidelity and space uniformity because a second spacer is formed when the profile of a partition pattern patterned by a first spacer is unstable, e.g., when horns are generated at the uppermost portion of the pattern.

SUMMARY OF THE INVENTION

Embodiments of the present invention are directed to providing a method for forming a fine pattern in a semiconductor device, which can secure pattern fidelity and space uniformity during a quadruple patterning process.

In accordance with an aspect of the present invention, there is provided a method for forming a fine pattern in a semiconductor device including forming a first partition layer over a first material layer which is formed over a substrate, performing a photo etch process on the first partition layer to form a first partition pattern, performing an oxidation process to form a first spacer sacrificial layer over a surface of the first partition pattern, forming a second spacer sacrificial layer over the substrate structure, forming a second partition layer filling gaps between the first partition pattern, removing the second spacer sacrificial layer, performing an oxidation process to form a third spacer sacrificial layer over a surface of the second partition layer and define a second partition pattern, forming a third partition pattern filling gaps between the first partition pattern and the second partition pattern, removing the first and third spacer sacrificial layers, and etching the first material layer using the first to third partition patterns.

In accordance with another aspect of the present invention, there is provided a method for forming a fine pattern in a semiconductor device including forming a first polysilicon layer over a first material layer which is formed over a substrate, performing a photo etch process on the first polysilicon layer to form a first partition pattern, performing a thermal oxidation process to form a first spacer sacrificial layer over a surface of the first partition pattern, forming a second spacer sacrificial layer over the substrate structure, forming a second polysilicon layer filling gaps between the first partition pattern, removing the second spacer sacrificial layer, performing a thermal oxidation process to form a third spacer sacrificial layer over a surface of the second polysilicon layer and define a second partition pattern, forming a third polysilicon layer filling gaps between the first partition pattern and the second partition pattern, the third polysilicon layer functioning as a third partition pattern, removing the first and third spacer sacrificial layers, and etching the first material layer using the first to third partition patterns.

In accordance with yet another aspect of the present invention, there is provided a method for forming a fine pattern in a semiconductor device including performing a photo etch process on a first partition layer to form a first partition pattern, wherein the first layer is formed over a substrate, performing an oxidation process to form a first spacer sacrificial layer over a surface of the first partition pattern, forming a second spacer sacrificial layer over the first spacer sacrificial layer, forming a second partition layer filling a gap formed by the second spacer sacrificial layer, removing the second spacer sacrificial layer to form a second partition layer, performing an oxidation process to form a third spacer sacrificial layer over the second partition layer and define a second partition pattern, forming a third partition pattern filling gaps formed by the first partition pattern and the second partition pattern, removing the first and third spacer sacrificial layers; and etching the first material layer using the first to third partition patterns.

In the present invention, repeatedly performing spacer patterning processes on one partition pattern is avoided by appropriately mixing a method for forming a spacer sacrificial layer for forming a space and a method for forming a spacer sacrificial layer through oxidizing a surface of a partition pattern.

BRIEF DESCRIPTION OF THE DRAWINGS

FIGS. 2A to 2M illustrate cross-sectional views of a method for forming a fine pattern using a quadruple patterning process in accordance with an embodiment of the present invention.

DESCRIPTION OF SPECIFIC EMBODIMENTS

Other objects and advantages of the present invention can be understood by the following description, and become apparent with reference to the embodiments of the present invention.

Embodiments of the present invention relate to a method for forming a fine pattern using a quadruple patterning in a semiconductor device. In the embodiments of the present invention, pattern fidelity and space uniformity may be secured because a spacer patterning is not repeatedly performed on one partition pattern.

Meanwhile, a critical dimension (CD) of a partition pattern may be large when etching a partition layer to form a first partition in accordance with the embodiments of the present invention. According to a typical method, it is difficult to have a large CD for a partition pattern considering the thickness of a spacer oxide layer because the spacer oxide layer is additionally formed after the partition pattern is formed. However, in accordance with the embodiments of the present invention, a thermal oxidation process is performed on a partition pattern without forming a spacer oxide layer, and thus a large CD of a partition pattern may be secured. Consequently, the large CD of a partition pattern allows securing a photo process margin. Furthermore, a bottom oxide layer may not be over etched when etching a polysilicon layer, unlike the typical method. Also, it is easy to secure an etch profile because a hard mask layer including tetraethyl orthosilicate (TEOS) exists below first to third partitions in accordance with the embodiments of the present invention. Moreover, a space CD between partitions may be easily controlled by controlling the thermal oxidation time.

The embodiments of the present invention will be described in detail with reference to the accompanying drawings so that those ordinary persons skilled in the art may be able to embody the present invention with ease.

Figure 1A:
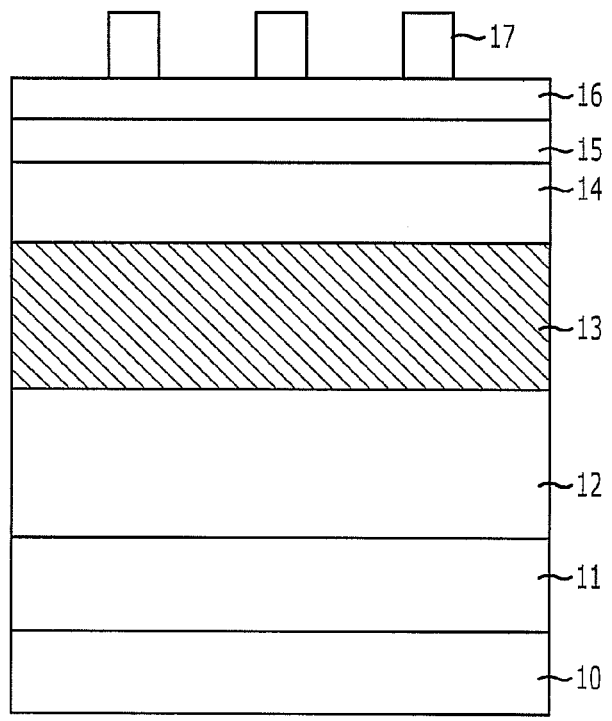
FIGS. 1A to 1G illustrate cross-sectional views of a typical method for forming a fine pattern by performing a pattern doubling technology using a spacer patterning method.
Figure 1B:
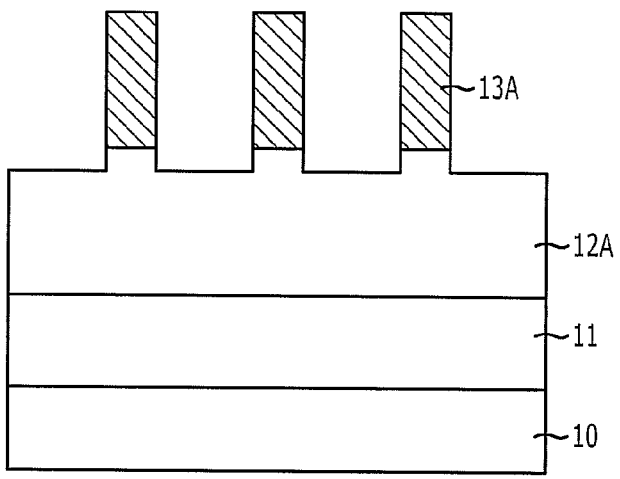
Figure 1C:
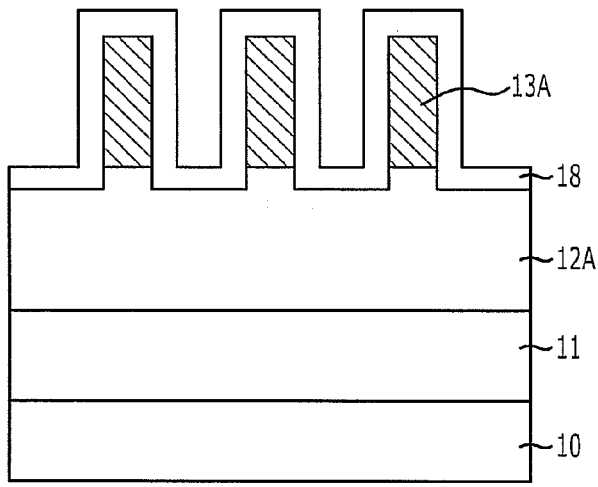
Figure 1D:
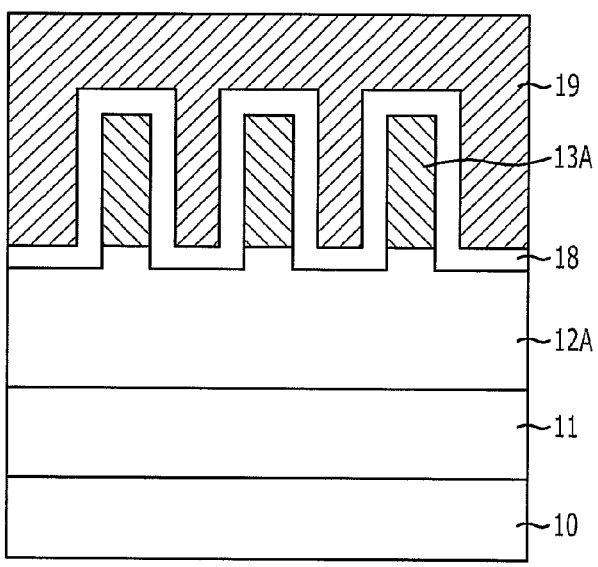
Figure 1E:
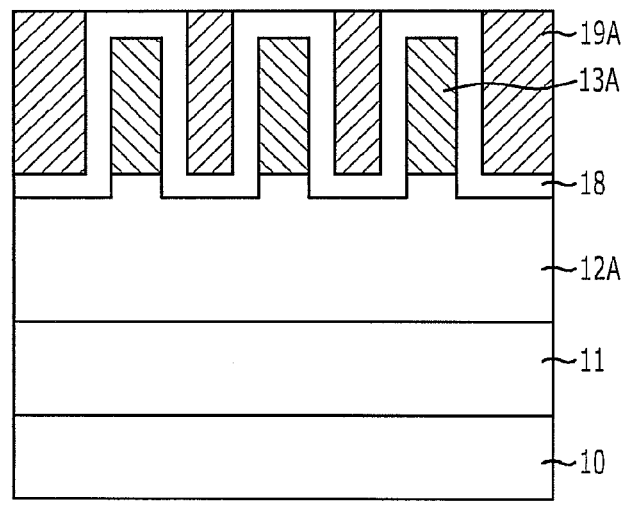
Figure 1F:
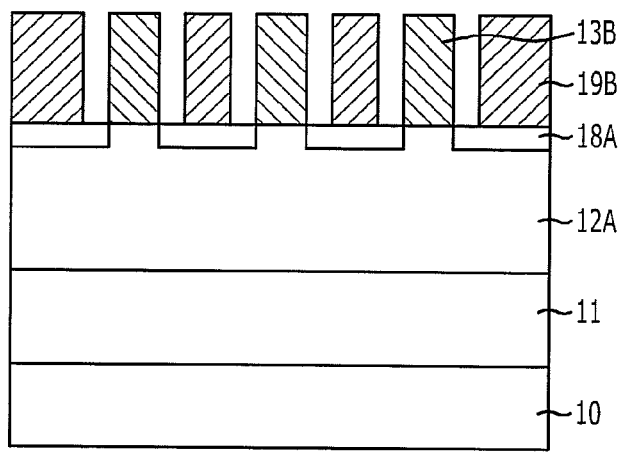
Figure 1G:
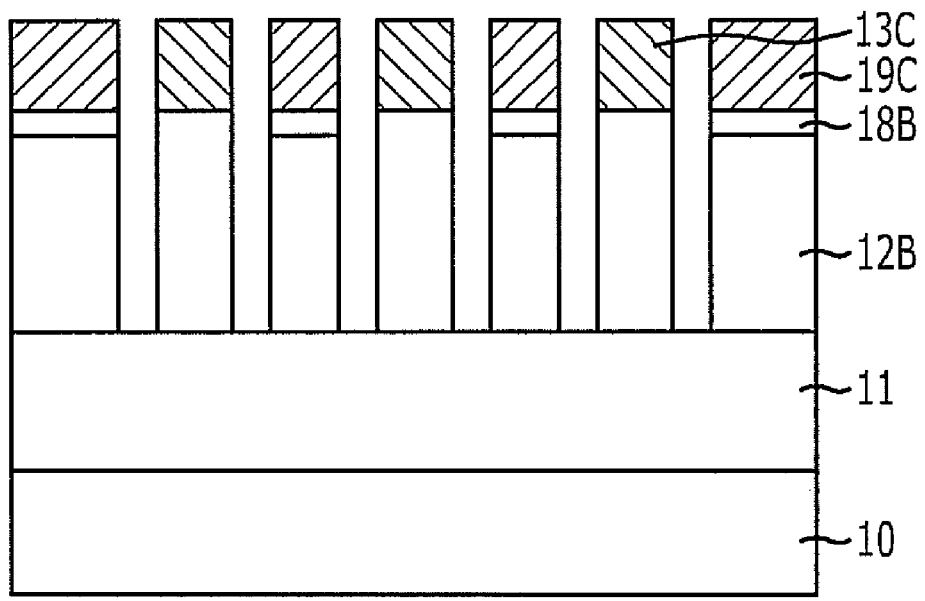
Figure 2A:
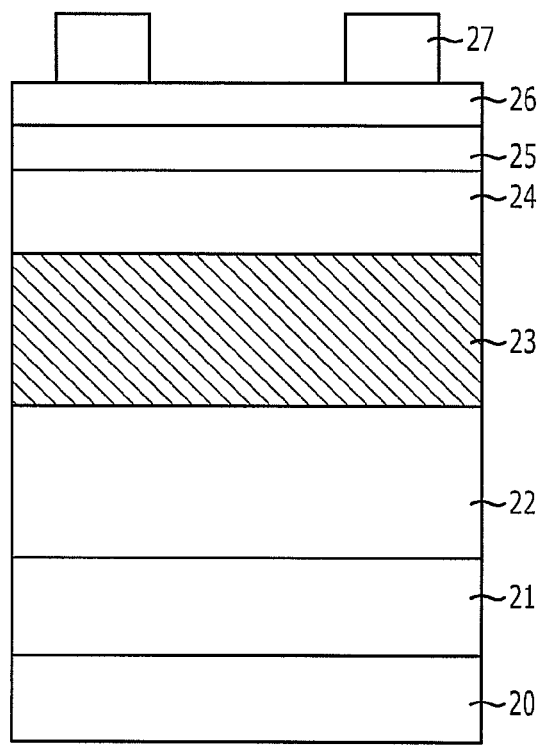

FIGS. 2A to 2M illustrate cross-sectional views of a method for forming a fine pattern using a quadruple patterning process in accordance with an embodiment of the present invention. Referring to FIG. 2A, the method for forming a fine pattern by performing a pattern doubling process using a spacer patterning method includes forming an etch target layer 21 over a substrate 20, forming a hard mask layer 22 including tetraethyl orthosilicate (TEOS) over the etch target layer 21, and forming a first polysilicon layer 23, an amorphous carbon layer 24, and a silicon oxynitride layer 25 over the hard mask layer 22. A bottom anti-reflective coating layer 26 and a photoresist layer are formed over the silicon oxynitride layer 25. A photo-exposure and developing process using a mask is performed to form a photoresist pattern 27. For instance, a ratio of line dimension to space dimension for the mask for forming the photoresist pattern 27 may be approximately 1:3. Considering the final critical dimension (CD) after patterning, the ratio may be in a range of approximately 1:0.5-3.

Figure 2B:
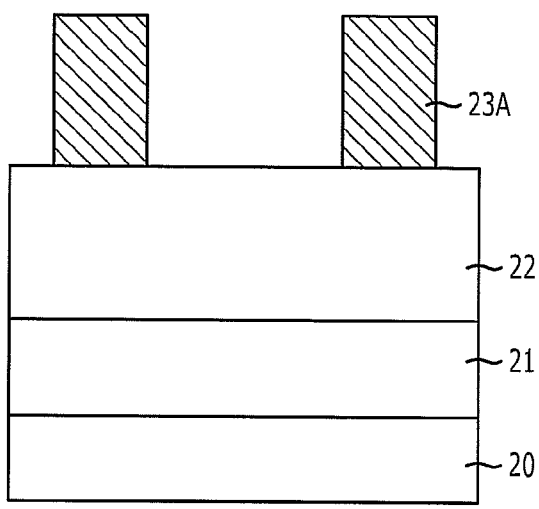

Referring to FIG. 2B, the bottom anti-reflective coating layer 26, the silicon oxynitride layer 25, and the amorphous carbon layer 24 are etched using the photoresist pattern 27 as an etch barrier. The first polysilicon layer 23 is etched using the etched amorphous carbon layer 24 as an etch barrier to form first polysilicon patterns 23A. Herein, the photoresist pattern 27 and remaining portions of the bottom anti-reflective coating layer 26, the silicon oxynitride layer 25, and the amorphous carbon layer 24 are mostly removed during the etching process.

Figure 2C:
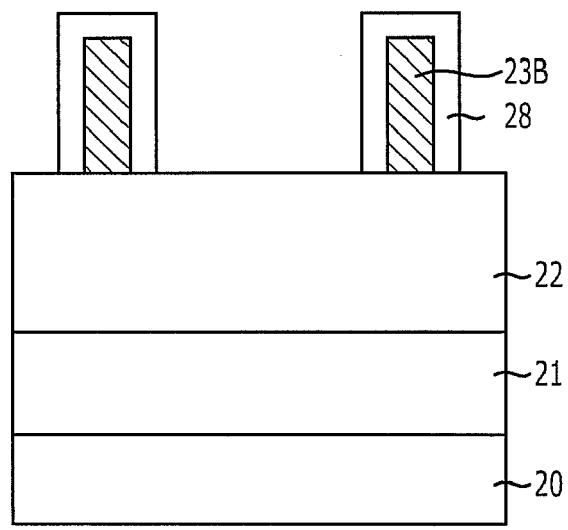

Referring to FIG. 2C, a thermal oxidation process is performed in a manner that first thermal oxide spacers 28 are formed over surfaces of the first polysilicon patterns 23A and non-reacted portions of the first polysilicon patterns 23A, where the first thermal oxide spacers 28 are not formed, become first partitions 23B. Herein, the thickness of the first thermal oxide spacers 28 is controlled by the thermal oxidation process time with a target of a desired space CD between the first partitions 23B and subsequent third partitions to be formed in FIG. 2K. A subsequent thermal oxidation process may also be considered herein.

Figure 2D:
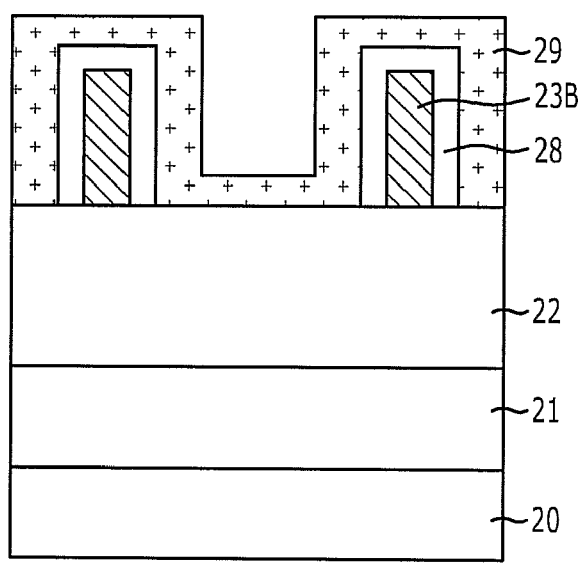

Referring to FIG. 2D, a spacer sacrificial layer 29 is formed over the surface profile of the substrate structure. Herein, the thickness of the spacer sacrificial layer 29 may be substantially the same as the desired thickness of the subsequent third partitions to be formed in FIG. 2K. For instance, in order to secure a selectivity during a subsequent removal process, the spacer sacrificial layer 29 may include a material layer having a selectivity with respect to the first thermal oxide spacers 28. For example, a silicon nitride (SiN) layer, a silicon oxynitride (SiON) layer, a silicon carbide (SiC) layer, and a silicon carbonitride (SiCN) layer may be used.

Figure 2E:
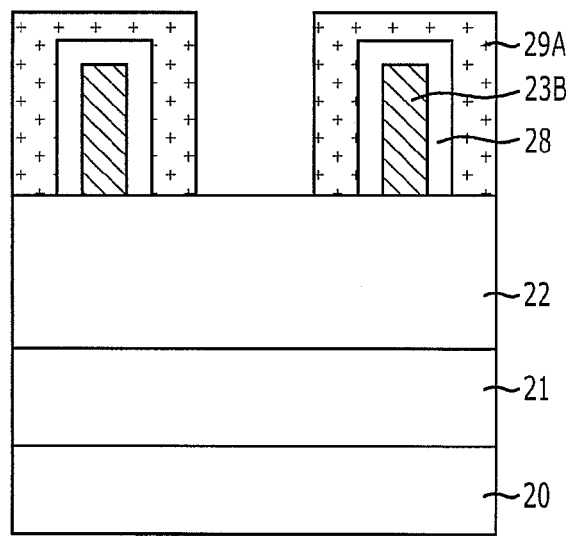

Referring to FIG. 2E, a bottom portion of the spacer sacrificial layer 29 is etched to expose a portion of the hard mask layer 22. Thus, spacer sacrificial patterns 29A are formed. This process is performed to prevent a height difference between the first partitions 23B and a subsequent second partition shown in FIG. 2I from increasing, and thus may be omitted. For instance, dry etch conditions are controlled in a manner that the etching is concentrated on the bottom portion of the spacer sacrificial layer 29 and does not expose upper portions of the first thermal oxide spacers 28.

Figure 2F:
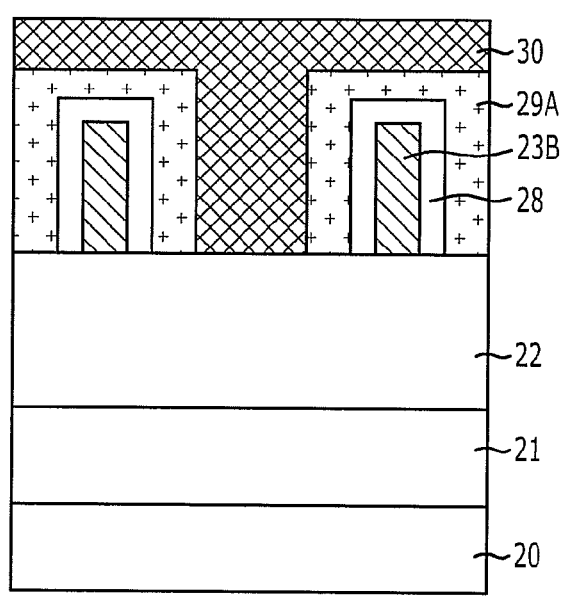

Referring to FIG. 2F, a second polysilicon layer 30 is formed over the substrate structure to form the subsequent second partition. Herein, the second polysilicon layer 30 is formed to a thickness sufficient to fill a space between the first partitions 23B.

Figure 2G:
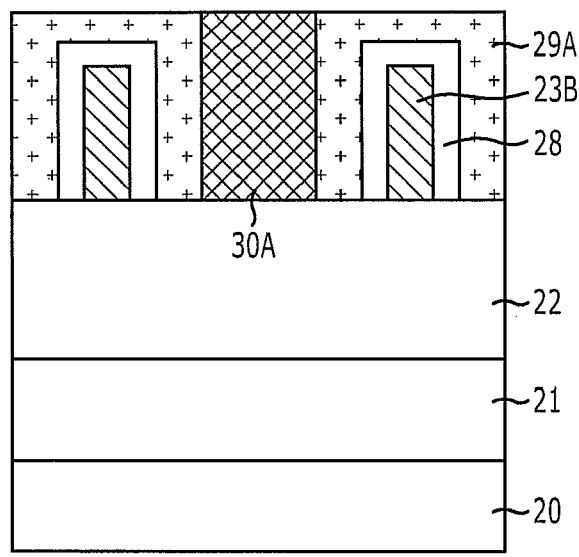

Referring to FIG. 2G, the second polysilicon layer 30 is recessed until the spacer sacrificial patterns 29A are exposed. Herein, an etch-back process or a chemical mechanical polishing (CMP) process may be performed to form a recessed second polysilicon pattern 30A.

Figure 2H:
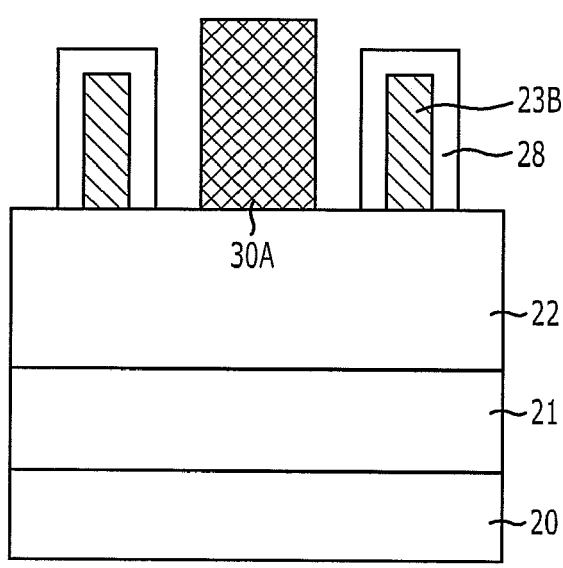

Referring to FIG. 2H, the spacer sacrificial patterns 29A are selectively etched and removed. Herein, the spacer sacrificial patterns 29A may be removed by performing a wet etch or performing a dry etch using a gas having a high selectivity with respect to the first thermal oxide spacers 28. For example, the gas having a high selectivity with respect to the first thermal oxide spacers 28 may include fluoroform ($CHF_3$), difluoromethane ($CH_2F_2$), and methyl fluoride ($CH_3F$). Consequently, the first partitions 23B and the second polysilicon pattern 30A are alternately formed.

Figure 2I:
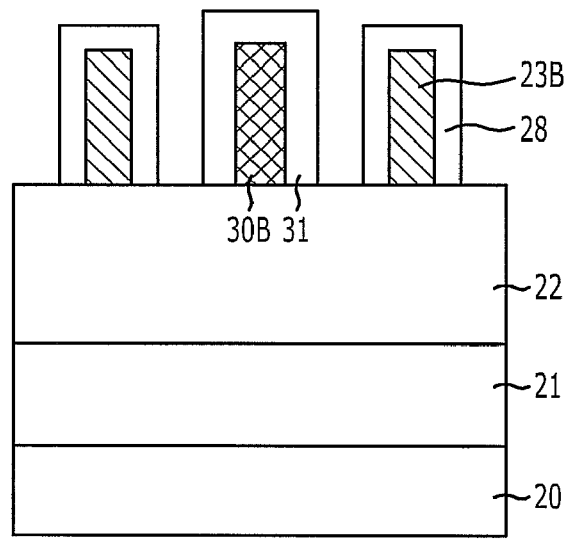

Referring to FIG. 2I, a thermal oxidation process is performed in a manner that a second thermal oxide spacer 31 is formed over a surface of the second polysilicon pattern 30A and a non-reacted portion of the second polysilicon pattern 30A, where the second thermal oxide spacer 31 is not formed, becomes a second partition 30B. Herein, the thickness of the second thermal oxide spacer 31 is controlled by the thermal oxidation process time considering a target CD for the second partition 30B as well as a desired space CD between the second partition 30B and subsequent third partitions.

Figure 2J:
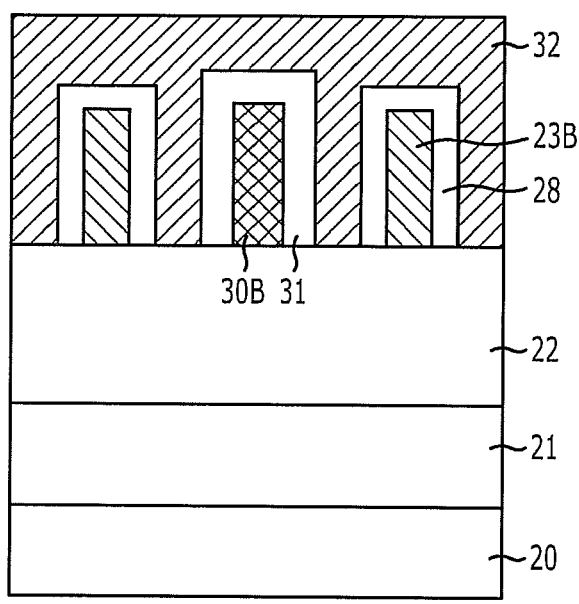

Referring to FIG. 2J, a third polysilicon layer 32 is formed over the substrate structure to form third partitions. Herein, the third polysilicon layer 32 is formed to a thickness sufficient to fill spaces between the first thermal oxide spacers 28 and the second thermal oxide spacer 31.

Figure 2K:
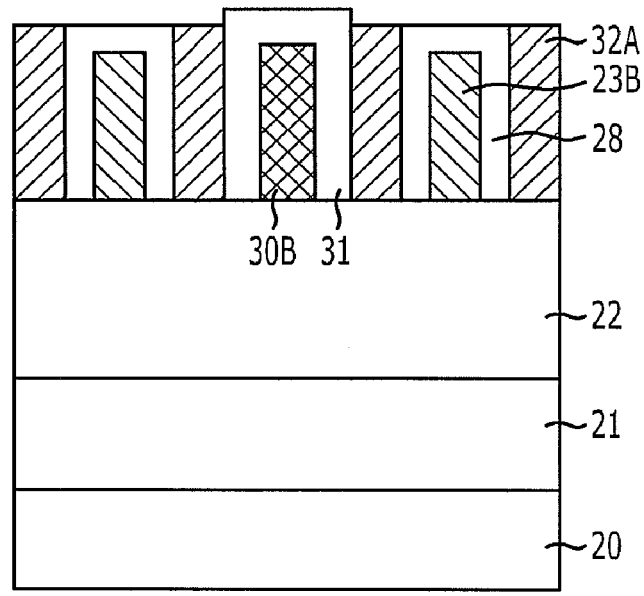

Referring to FIG. 2K, the third polysilicon layer 32 is recessed until the first thermal oxide spacers 28 and the second thermal oxide spacer 31 are exposed. An etch-back process or a CMP process may be performed to form third polysilicon patterns 32A functioning as the third partitions.

Figure 2L:
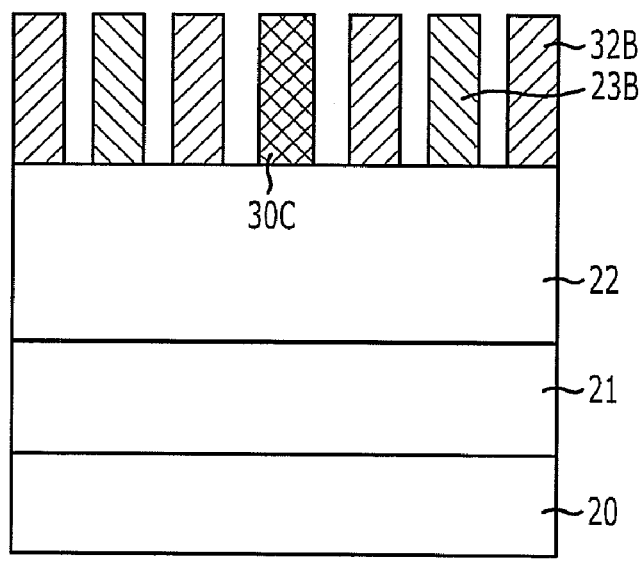

Referring to FIG. 2L, the first thermal oxide spacers 28 and the second thermal oxide spacer 31 are selectively etched and removed. For instance, a dry etch process using a gas having a high selectivity with respect to polysilicon may be used to minimized losses of the polysilicon patterns, that is, the first partitions 23B, the second partition 30B, and the third polysilicon patterns 32A. The gas having a high selectivity with respect to polysilicon may include $C_4F_6$, $C_6F_6$, $CHF_3$, and $CH_2F_2$. Reference denotations 30C and 32B represent an etched second partition 30C and etched third polysilicon patterns 32B, respectively.

Referring to FIG. 2M, the hard mask layer 22 is etched using the polysilicon patterns functioning as the first to third partitions, i.e., the first partitions 23B, the etched second partition 30C, and the etched third polysilicon patterns 32B, as an etch barrier to form a hard mask 22A.

Reference denotations 23C, 30D, and 32C represent remaining first partitions 23C, a remaining second partition 30D, and remaining third polysilicon patterns 32C, respectively.

Although not illustrated, the etch target layer 21 is etched using the hard mask 22A as an etch barrier. Material layers remaining over the etched etch target layer 21 are removed to complete a patterning process on the etch target layer 21. It is possible to form the hard mask layer 22 including TEOS as an etch target layer instead of a hard mask layer.

In accordance with the embodiment of the present invention, repeatedly performing spacer patterning processes on one partition pattern may be avoided by appropriately mixing a method for forming a spacer sacrificial layer for forming a space and a method for forming a spacer sacrificial layer through oxidizing a surface of a partition pattern. In this case, pattern fidelity and space uniformity may be easy to control because spacers are formed when fidelity of partition patterns is secured.

While the present invention has been described with respect to the specific embodiments, it will be apparent to those skilled in the art that various changes and modifications may be made without departing from the spirit and scope of the invention as defined in the following claims.

For instance, although polysilicon layers are used to form the first to third partitions in the above described embodiment, any material which can be oxidized and has an etch selectivity with respect to a bottom layer may be used.

Furthermore, although thermal oxidation processes are performed to form spacer oxide layers in the above described embodiment, other types of oxidation processes may be used depending on the types of partition materials.

Also, although a hard mask (an amorphous carbon layer and a silicon oxynitride layer) is used to pattern the first partitions in the above described embodiment, the hard mask does not have to be used because the hard mask is used to improve selectivity and profile during etching.

What is claimed is:
1. A method for forming a fine pattern in a semiconductor device, comprising:
   forming a first partition layer over a first material layer which is formed over a substrate;
   performing a photo etch process on the first partition layer to form a first partition pattern;
   performing an oxidation process to form a first spacer sacrificial layer over a surface of the first partition pattern;
   forming a second spacer sacrificial layer over the substrate structure;
   forming a second partition layer filling gaps between the first partition pattern;
   removing the second spacer sacrificial layer;

performing an oxidation process to form a third spacer sacrificial layer over a surface of the second partition layer and define a second partition pattern;

forming a third partition pattern filling gaps between the first partition pattern and the second partition pattern;

removing the first and third spacer sacrificial layers; and etching the first material layer using the first to third partition patterns.

2. The method of claim 1, further comprising etching a second material layer formed over the substrate using the etched first material layer.

3. The method of claim 1, wherein the forming of the second partition layer includes:

forming a second partition material layer over the substrate structure; and recessing the second partition material layer until the second spacer sacrificial layer is exposed.

4. The method of claim 1, wherein the forming of the third partition pattern includes:

forming a third partition layer over the substrate structure; and recessing the third partition layer until the first and third spacer sacrificial layers are exposed, thereby defining the third partition pattern.

5. The method of claim 3, wherein the forming of the second spacer sacrificial layer includes using one of a silicon nitride (SiN) layer, a silicon oxynitride (SiON) layer, a silicon carbide (SiC) layer, and a silicon carbonitride (SiCN) layer.

6. The method of claim 5, the removing of the second spacer sacrificial layer includes performing a wet etch process.

7. The method of claim 5, wherein the removing of the second spacer sacrificial layer includes performing a dry etch process using any one of fluoroform ($CHF_3$) gas, difluoromethane($CH_2F_2$) gas, and methyl fluoride ($CH_3F$) gas.

8. A method for forming a fine pattern in a semiconductor device, comprising:

forming a first polysilicon layer over a first material layer which is formed over a substrate;

performing a photo etch process on the first polysilicon layer to form a first partition pattern;

performing a thermal oxidation process to form a first spacer sacrificial layer over a surface of the first partition pattern;

forming a second spacer sacrificial layer over the substrate structure;

forming a second polysilicon layer filling gaps between the first partition pattern;

removing the second spacer sacrificial layer;

performing a thermal oxidation process to form a third spacer sacrificial layer over a surface of the second polysilicon layer and define a second partition pattern;

forming a third polysilicon layer filling gaps between the first partition pattern and the second partition pattern, the third polysilicon layer functioning as a third partition pattern;

removing the first and third spacer sacrificial layers; and etching the first material layer using the first to third partition patterns.

9. The method of claim 8, wherein the performing of the photo etch process on the first polysilicon layer to form the first partition pattern includes:

forming an amorphous carbon layer and a silicon oxynitride layer over the first polysilicon layer;

forming a bottom anti-reflective coating layer and a photoresist layer over the silicon oxynitride layer;

performing a photo-exposure and developing process to form a photoresist pattern; and etching the bottom anti-reflective coating layer, the silicon oxynitride layer, and the amorphous carbon layer using the photoresist pattern.

10. The method of claim 9, wherein a ratio of line dimension to space dimension for a mask for forming the photoresist pattern ranges from approximately 1:0.5 to approximately 1:3.

11. The method of claim 8, further comprising etching a second material layer formed over the substrate using the etched first material layer.

12. The method of claim 8, wherein the forming of the second polysilicon layer includes:

forming a second polysilicon material layer over the substrate structure; and recessing the second polysilicon material layer until the second spacer sacrificial layer is exposed.

13. The method of claim 12, wherein the forming of the third polysilicon layer includes:

forming a third polysilicon material layer over the substrate structure; and recessing the third polysilicon material layer until the first and third spacer sacrificial layers are exposed, thereby defining the third partition pattern.

14. The method of claim 8, wherein the forming of the second spacer sacrificial layer includes using one of a silicon nitride (SiN) layer, a silicon oxynitride (SiON) layer, a silicon carbide (SiC) layer, and a silicon carbonitride (SiCN) layer.

15. The method of claim 14, wherein the removing of the second spacer sacrificial layer includes performing a wet etch process.

16. The method of claim 14, wherein the removing of the second spacer sacrificial layer includes performing a dry etch process using any one of fluoroform ($CHF_3$) gas, difluoromethane($CH_2F_2$) gas, and methyl fluoride ($CH_3F$) gas.

17. The method of claim 8, wherein the removing of the first and third spacer sacrificial layers includes performing a dry etch process using any one of $C_4F_6$ gas, $C_6F_6$ gas, $CHF_3$ gas, and $CH_2F_2$ gas.

18. A method for forming a fine pattern in a semiconductor device, comprising:

performing a photo etch process on a first partition layer to form a first partition pattern over a substrate having a first material layer;

performing an oxidation process to form a first spacer sacrificial layer over a surface of the first partition pattern;

forming a second spacer sacrificial layer over the first spacer sacrificial layer;

forming a second partition layer filling a gap formed by the second spacer sacrificial layer;

removing the second spacer sacrificial layer to form a second partition layer;

performing an oxidation process to form a third spacer sacrificial layer over the second partition layer and define a second partition pattern;

forming a third partition pattern filling gaps formed by the first partition pattern and the second partition pattern;

removing the first and third spacer sacrificial layers; and etching the first material layer using the first to third partition patterns.

19. The method of claim 18, further comprising etching a second material layer formed over the substrate using the etched first material layer.

* * * * *